United States Patent
En et al.

(10) Patent No.: US 6,509,613 B1
(45) Date of Patent: Jan. 21, 2003

(54) SELF-ALIGNED FLOATING BODY CONTROL FOR SOI DEVICE THROUGH LEAKAGE ENHANCED BURIED OXIDE

(75) Inventors: William George En, Milpitas, CA (US); Srinath Krishnan, Campbell, CA (US); Judy Xilin An, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/849,494

(22) Filed: May 4, 2001

(51) Int. Cl.[7] .............................................. H01L 27/01
(52) U.S. Cl. ...................... 257/349; 257/347; 257/348; 257/376
(58) Field of Search ................................. 257/347, 348, 257/349, 376; 438/162, 149, 157

(56) References Cited

U.S. PATENT DOCUMENTS

| | | | |
|---|---|---|---|
| 5,360,752 A | 11/1994 | Brady | ........................ 437/62 |
| 5,489,792 A | 2/1996 | Hu et al. | |
| 5,527,724 A * | 6/1996 | Brady et al. | ......... 148/DIG. 40 |
| 5,982,003 A | 11/1999 | Hu et al. | |
| 6,005,285 A * | 12/1999 | Gardner et al. | ............. 257/607 |
| 6,121,077 A | 9/2000 | Hu et al. | |
| 6,210,998 B1 * | 4/2001 | Son | ............................. 257/347 |
| 6,288,425 B1 * | 9/2001 | Adan | .......................... 257/347 |
| 6,337,500 B1 * | 1/2002 | Nakaoka et al. | ............ 257/347 |

* cited by examiner

Primary Examiner—Michael S. Lebentritt
Assistant Examiner—Douglas M Menz
(74) Attorney, Agent, or Firm—Renner, Otto, Boisselle & Sklar, LLP

(57) ABSTRACT

A semiconductor-on-insulator (SOI) device formed on an SOI structure with a buried oxide (BOX) layer disposed therein and an active region disposed on the BOX layer having active regions defined by isolation trenches and the BOX layer. The SOI device includes a gate formed over one of the active regions. The gate defines a channel interposed between a source and a drain formed within one of the active regions. The SOI device includes a leakage enhanced region within the BOX layer defined by the gate.

15 Claims, 5 Drawing Sheets

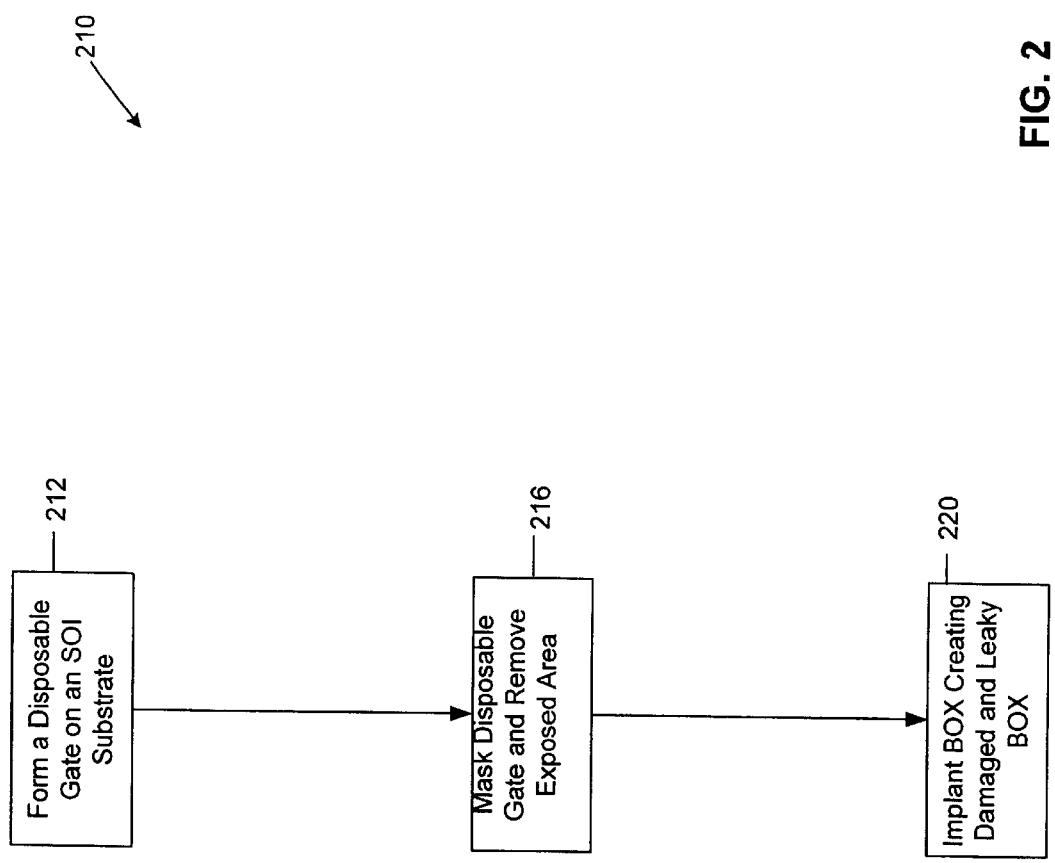

US 6,509,613 B1

SELF-ALIGNED FLOATING BODY CONTROL FOR SOI DEVICE THROUGH LEAKAGE ENHANCED BURIED OXIDE

TECHNICAL FIELD

The present invention generally relates to the manufacture of semiconductor-on-insulator (SOI) devices, and, more specifically, relates to the manufacture of SOI devices with enhanced floating body control through a leakage enhanced buried oxide.

BACKGROUND ART

Semiconductor-on-insulator (SOI) structures have several advantages over conventional bulk substrates: the elimination of latch-up, reduced short-channel effects, improved radiation hardness, dynamic coupling, lower parasitic junction capacitance, and simplified device isolation and fabrication. Such advantages allow semiconductor device manufacturers to produce low-voltage, low-power, high-speed devices thereon. For example, metal-oxide semiconductor field effect transistors (MOSFETs) are commonly formed on SOI structures. However, MOSFETs formed on such SOI structures suffer from a floating body effect (FBE).

Unlike bulk silicon MOSFETs, an SOI MOSFET is usually electrically floating in relation to the substrate. In a non-fully depleted MOSFET, carriers (holes in nMOSFETs and electrons in pMOSFETs) generated by impact ionization accumulate near the source/body junctions of the MOSFET. Eventually, sufficient carriers will accumulate to forward bias the body with respect to the source thus lowering the threshold voltage through the body-bias effect. Extra current will start flowing resulting in a "kink" in the I-V characteristics. The extra current flow reduces the achievable gain and dynamic swing in analog circuits, and gives rise to an abnormality in the transfer characteristics in digital circuits. Additionally, the FBE causes higher device leakages and undesirable transient effects.

One attempted solution to solve problems due to the FBE is to provide a contact to the body for hole current collection. However, currently available hole collection schemes, including the use of a side-contact or a mosaic source, are very inefficient and consume significant amounts of wafer area.

Therefore, there exists a strong need in the art for an SOI structure with a buried insulator layer that bleeds off extra carriers through a channel defined by a device to the substrate.

SUMMARY OF THE INVENTION

According to one aspect of the invention, the invention is a semiconductor-on-insulator (SOI) device formed on an SOI structure. The MOSFET device includes a gate defining a channel (e.g. a p-type doped region) interposed between a source and a drain formed within one of the active regions defined by isolation trenches and a BOX layer. The SOI device includes a leakage enhanced region within the BOX layer defined by the gate.

According to another aspect of the invention, the invention is a method of fabricating an SOI device on an SOI structure. The method includes the step of forming an SOI substrate with a buried oxide (BOX) layer disposed thereon and an active layer disposed on the BOX layer having active regions defined by isolation trenches and the BOX layer. Next, a disposable gate is formed on the active region. During the formation of the disposable gate, a source and a drain are formed within one of the active regions with a channel defined by the disposable gate interposed between the source and the drain. Then, the disposable gate is removed and a leakage enhanced region is formed in the BOX layer through the removed disposable gate. Next, an active gate is formed on the active region where the disposable gate was removed.

BRIEF DESCRIPTION OF DRAWINGS

These and further features of the present invention will be apparent with reference to the following description and drawings, wherein:

FIG. 2 is a flow diagram of a method of manufacturing the SOI device according to the present invention;

DISCLOSURE OF INVENTION

To illustrate the present invention in a clear and concise manner, the drawings may not necessarily be to scale and certain features may be shown in a partial schematic format.

The present invention is a device, e.g. a metal-oxide field effect transistor (MOSFET), or the like, formed on a semiconductor-on-insulator substrate (SOI). In one embodiment, the MOSFET device comprises a gate formed on an active region of an SOI structure. The gate defines a channel, e.g., a p-type doped region, interposed between two identical deeply doped regions with lightly doped shallow extensions within the active region on the SOI structure. Interposed between a gate electrode and the channel region is a gate dielectric. The SOI device is electrically isolated horizontally by isolation trenches and vertically by a buried oxide layer. The buried oxide layer has been implanted with an impurity of heavy ions underneath the channel region in order to form a leakage enhanced region or oxide trap region in the BOX layer self-aligned with the gate.

The SOI MOSFET device in accordance with the present invention is capable of operating at significantly higher speeds than traditional MOSFET devices formed on conventional SOI structures. The self-aligned leakage enhanced region of the buried oxide layer allows more carriers to pass through this region (leak) to the main substrate than a BOX layer of the conventional SOI structure. This leakage reduces the floating body effect. Although the self-aligned leakage enhanced region is "leakier", the region still provides isolation comparable to the conventional BOX layer of an SOI structure. Thus, the increased leakage improves the device performance by reducing the floating body effect and maintains the advantages of an SOI structure.

Figure 1:
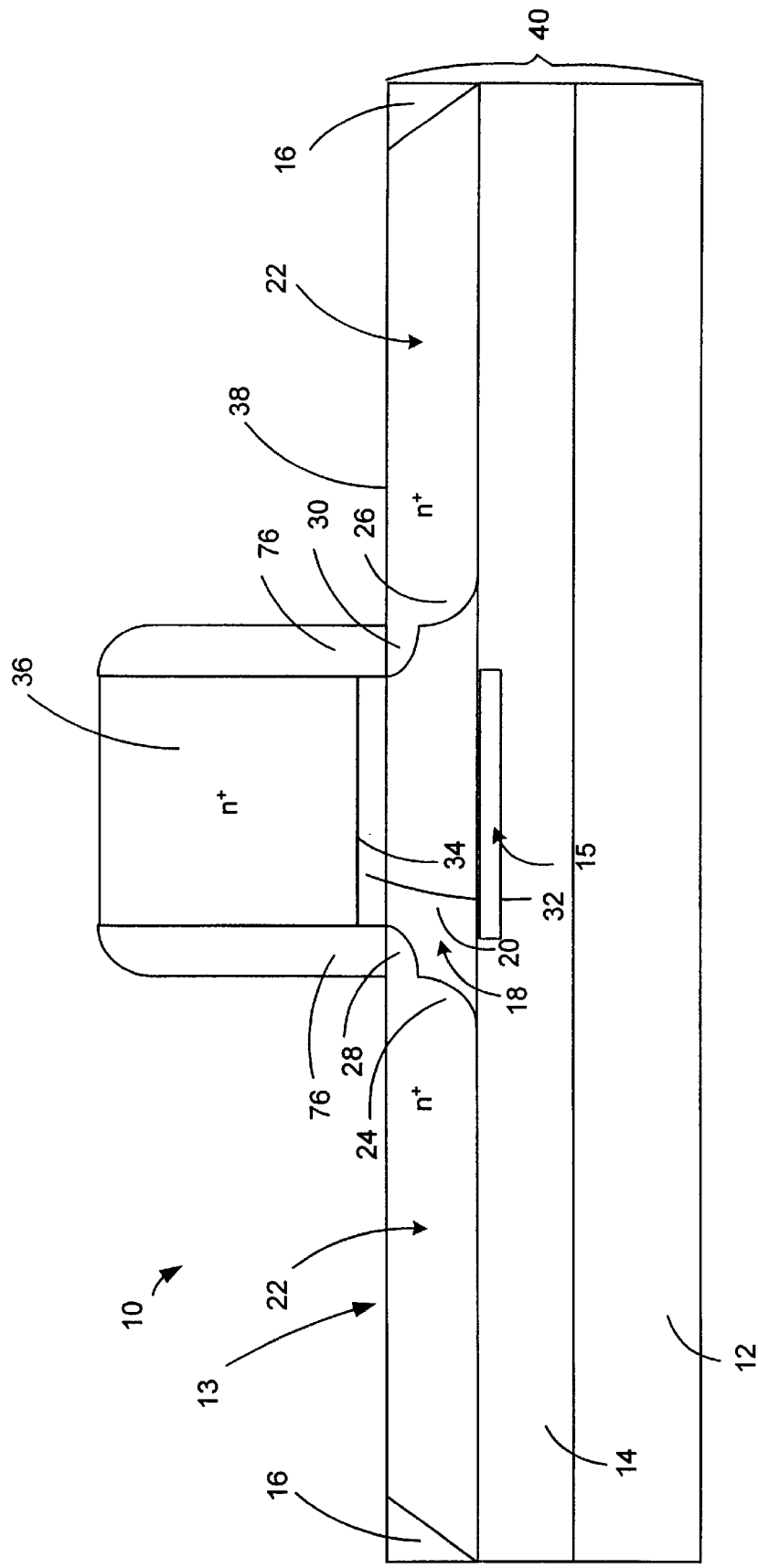
FIG. 1 is a cross-section of an SOI device according to an embodiment of the present invention.

Referring initially to FIG. 1, an embodiment of a SOI MOSFET device 10 will now be described in more detail. The MOSFET device 10 is formed using a semiconductor-on-insulator (SOI) structure having a semiconductor substrate 12, a buried oxide (BOX) layer 14 formed on the semiconductor substrate 12 and a semiconductor layer 13 disposed on the BOX layer 14. Formed within the BOX layer 14 is a leakage enhanced region 15 self-aligned with the MOSFET device 10. The self-aligned leakage enhanced region 15 is below a channel 20 defined by the MOSFET device 10. The self-aligned leakage enhanced region 15 may be implanted with ions which include indium (In) for an N-channel device; arsenic (As) or antimony (Sb) for a P-channel device; and germanium (Ge), argon (Ar), neon (Ne), silicon (Si) or xenon (Xe) for either an N-channel or P-channel device. Additionally may be used as the implant ions. An exemplary BOX layer 14 may have a thickness of between 500 Å and 2000 Å. Whereas, an exemplary semiconductor layer 13 disposed on the BOX layer 14 may have a thickness of between 100 Å and 500 Å. Suitable semiconductor materials such as silicon, carbide, germanium, or the like, may be used as the semiconductor substrate 12 or the semiconductor layer 13. Within the semiconductor layer 13 disposed on the BOX layer 14, shallow trench isolation (STI) regions 16 define the placement of a semiconductor active region 18. Active region 18 is further defined by the BOX layer 14. The STI regions 16 are insulator-filled, e.g. with tetraethylorthosilicate (TEOS), or the like, to electrically isolate individual electrical devices such as the SOI MOSFET device 10 within respectively defined active regions. Other isolation techniques that are known in the art may be used to isolate the SOI MOSFET device 10.

In an exemplary embodiment, as illustrated in FIG. 1, the active region 18 has formed therein a p-type region, or channel 20, and two N+ regions, or a source and a drain 22. The channel 20 is interposed between the two N+ regions 22. (Alternatively, an n-type channel could be interposed between two P+ regions.) The two N+ regions 22 have respective deep implant regions 24 and 26, as well as respective extension regions 28 and 30. The active region 18 may be predoped prior to the manufacturing of the gate of the SOI MOSFET device 10 with p-type dopants for n-type channel devices and/or n-type dopants for p-type channel devices. Alternatively, the active region 18 may be doped during the manufacturing of the gate in a process more fully described below. An exemplary range of concentration of these dopants is between $1\times10^{18}$ atoms/cm$^3$ and $5\times10^{18}$ atoms/cm$^3$ for the p-type channel 20 and between $1\times10^{20}$ atoms/cm$^3$ and $2\times10^{20}$ atoms/cm$^3$ for the N+ regions 22.

A gate dielectric 32 is interposed between the lower surface 34 of an N+ gate electrode 36 and an upper surface 38 of the SOI semiconductor substrate 40. The gate dielectric 32 illustrated in FIG. 1 is a single layer dielectric, however the gate dielectric could be a multi-layer dielectric. The gate dielectric 32 may be made of suitable gate dielectric materials, such as aluminum oxide ($Al_2O_3$), hafnium oxide ($HfO_2$), zirconium oxide ($ZrO_2$), tantalum oxide ($Ta_2O_5$), or the like. In this embodiment, dielectric layer 32 is made of $SiO_2$. An exemplary dielectric layer 32 of $SiO_2$ may have a thickness of about 10 Å. The N+ gate electrode 36 may be made of typical, well-known gate electrode materials, for example polysilicon, Si/Ge, metal, or the like. An exemplary N+ gate electrode 36 may have a thickness of between 250 Å and 750 Å.

It will be appreciated that the self-aligned leakage enhanced region 15, the channel region 20, the source and the drain 22, the gate dielectric 32, and the N+ gate electrode 36, together form the SOI MOSFET device of the present invention. The principles of operation of a MOSFET are well known. It will further be appreciated that the MOSFET device 10 may alternatively have other shapes than the shape shown in FIG. 1.

Spacers 76 extend upward from the upper surface 38 of the SOI structure 40 on either side of the gate electrode 36. The spacers 76 extend substantially to the top of the gate electrode 36. Exemplary spacers 76 may have a height of between 260 Å and 760 Å.

Although the illustrated device is a MOSFET device with a self-aligned leakage enhanced region on an SOI structure, other devices on conventional SOI structures can also be improved using the enhanced leakage characteristics of the self-aligned enhanced leakage region within the buried oxide layer of the SOI structure described herein.

Figure 3A:
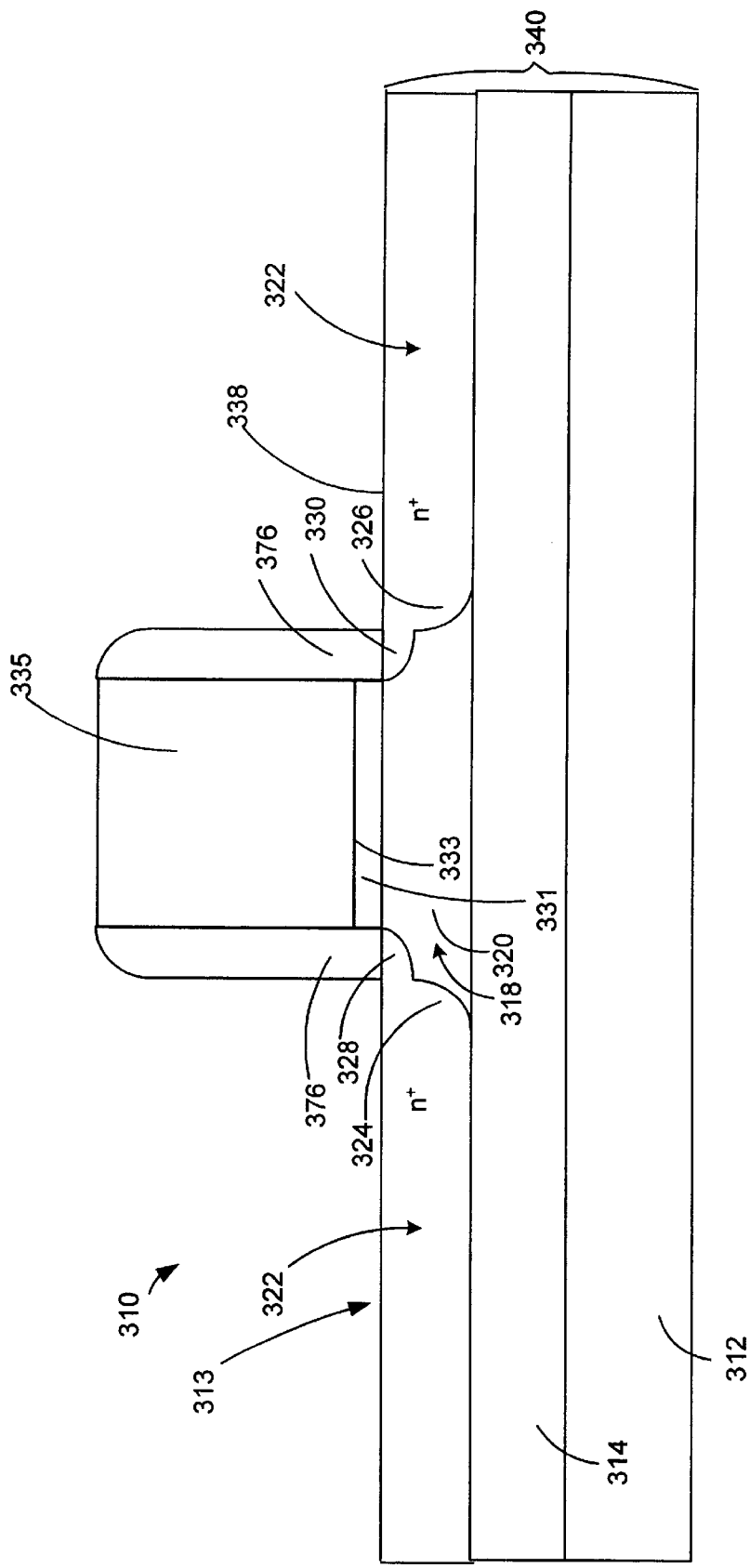
FIG. 3A is a cross-section of the SOI device according to the present invention in a first intermediate stage of manufacture.
Figure 3B:
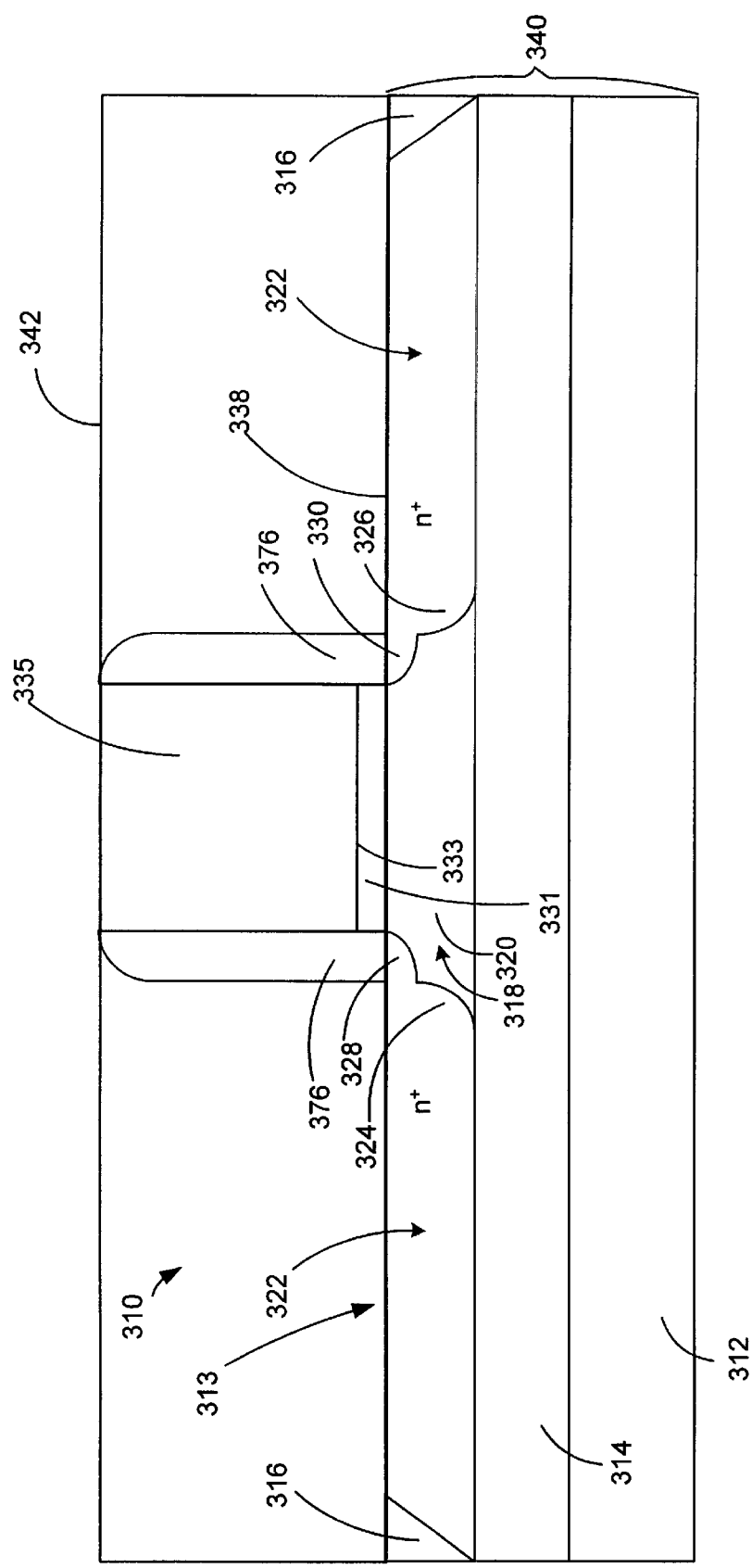
FIG. 3B is a cross-section of the SOI device according to the present invention in a second intermediate stage of manufacture.
Figure 3C:
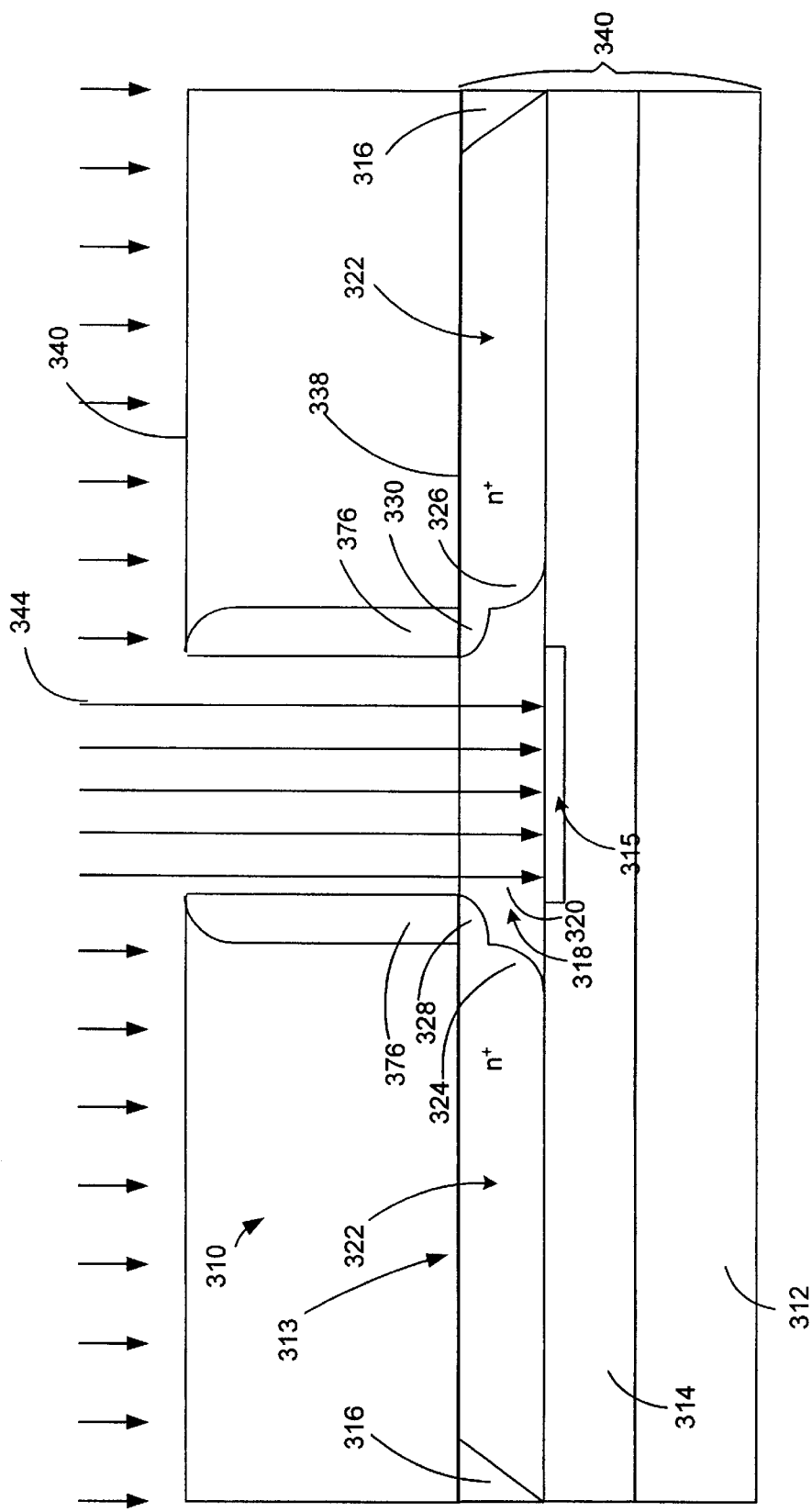
FIG. 3C is a cross-section of the SOI device according to the present invention in a third intermediate stage of manufacture.

The steps of a method 210 for fabricating an SOI device 310 (which may be similar to the SOI device 10 described above) are outlined in the flow chart shown in FIG. 2. FIGS. 3A–3C illustrate various steps of the method 210. It will be appreciated that the method 210 and the semiconductor device 310 described below are merely exemplary, and that suitable embodiments of the many above-described variations in materials, thicknesses, and/or structures may alternatively be used in the method 210 and/or the semiconductor device 310.

In step 212, a disposable gate is formed on an SOI structure 340 as represented in FIG. 3A. The SOI structure 340 includes a semiconductor substrate 312, a buried oxide (BOX) layer 314 formed on the semiconductor substrate 312 and a semiconductor layer 313 disposed on the BOX layer 314. A disposable gate dielectric 331 is interposed between the lower surface 333 of a disposable gate electrode 335 and an upper surface 338 of the SOI substrate 340. The disposable gate dielectric 331 illustrated in FIG. 3A is a single layer dielectric. The disposable gate dielectric 331 may be made of suitable gate dielectric materials, such as aluminum oxide ($Al_2O_3$), hafnium oxide ($HfO_2$), tantalum oxide ($Ta_2O_5$), zirconium oxide ($ZrO_2$), or the like. In this embodiment, disposable gate dielectric layer 331 is made of $SiO_2$. An exemplary disposable dielectric layer 331 of $SiO_2$ may have a thickness of about 10 Å. The disposable gate electrode 335 may be made of nitride, or the like. An exemplary disposable gate electrode 335 may have a thickness of between 250 Å and 750 Å.

If the extensions 328 and 330 are desired these are formed after the disposable gate is formed and prior to formation of the spacers 376. An extension perpendicular implant may be performed at this time. The extension perpendicular implant is a relatively low energy, low concentration implant which is capable of producing the source and drain extensions 328 and 330. The total concentration of the extension implants may be, for example, between $1\times10^{19}$ atoms/cm$^3$ and $1\times10^{20}$ atoms/cm$^3$. The extension perpendicular implants may be of the same material as the main perpendicular implant, or may alternatively include different materials. It should be further appreciated that the extension implants may be different from one another, if so desired.

Next, spacers 376 are formed around the gate, as illustrated in FIG. 3A. Spacers 376 extend upward from the upper surface 338 of the SOI structure 340 on either side of the disposable gate electrode 335. Exemplary spacers 376 may have a height of between 260 Å and 760 Å.

The implanting of regions of the semiconductor substrate 340 follows the formation of spacers 376. The implanting that may be performed during the disposable gate device formation is described below. The implants produce source and drain regions 322 in the substrate 340. A channel region 320 defined by the gate, between the source and the drain 322 remains p-type doped.

The source and the drain regions 322 have respective source and drain deep implant regions 324 and 326, and may have respective source and drain extensions 328 and 330 as described above, if desired. The source and drain regions may be formed by a main perpendicular implant as described below.

The main source and drain regions may be formed after spacer 376 formation by a main perpendicular implant, which will not affect the extension implant due to the spacers 376 acting as masks. The main perpendicular implant is a relatively high energy, high concentration implant which is capable of producing the source and drain deep implant regions 324 and 326. An exemplary range of implant dose for the main perpendicular implant is between $1 \times 10^{15}$ atoms/cm$^2$ and $2 \times 10^{15}$ atoms/cm$^2$.

Although the extension implantation and the main implantation are illustrated as each involving one implant, it will be appreciated that a greater number of implants may be employed. Further, halo implants may be used in forming the extension implantation after gate patterning or/and spacers 376 formation. For example, tilt angle extension implants (35–45 degrees) implanting In or BF$_2$ utilizing four rotations for a total implantation dose of between $3.5 \times 10^{13}$ atoms/cm$^2$ and $5 \times 10^{13}$ atoms/cm$^2$ with energies between 30–80 keV.

It will be appreciated that many alternative sequences or steps may be used to accomplish the implantation. For example, the extension implants and the main implants may be performed before the formation of the disposable gate dielectric 331 upon the SOI structure 340 by conventional, well-known methods and means.

After implantation, the semiconductor device 310 is subjected to rapid thermal annealing (RTA). Exemplary RTA may be performed for between five and fifteen seconds at a temperature of 1,020° C.–1,050° C.

Next, in step 216, the disposable gate is removed and the formation of shallow trench isolation (STI) regions 316 is initiated. The initial step in forming the STI regions is to form trenches in the SOI structure 340 at the locations which will define the active region 318 boundaries. Next the semiconductor layer 313 is oxidized to round off the corners. Then, the oxide is removed during a water rinse. This is followed by a deposition of a TEOS layer on the SOI structure 340 and on the disposable nitride gate (not shown). The layer of TEOS reaches between 500 Å and 1000 Å above the nitride layer 335 of the disposable gate. Next, the TEOS is polished back to the top surface of the nitride layer 335 of the disposable gate. The result of this step is a TEOS layer 342, which is illustrated on opposite sides of the gate device 310, respectively, in FIG. 3B. TEOS layer 342 covers the exposed surfaces of the spacers 376. The polishing is done using conventional techniques, which are well-known in the art.

Next, an etch of hot phosphoric acid is performed down to the upper surface 338 of the SOI structure 340 within an area defined by the spacers 376. Thus all of the nitride layer 335, and the oxide layer 331 are removed, thereby leaving the upper surface 338 of the channel 320 exposed. It will be appreciated that other suitable selective etching methods well-known in the art may be used.

Now in step 220, and as illustrated in FIG. 3C, a self-aligned enhanced leakage region 315 or oxide trap region is formed by implanting heavy ions 344 into the SOI structure 340. More specifically, the ions are implanted with an energy so that the majority of the ions traverse the active region 318 to impinge upon and damage an upper surface of the BOX layer 314, thereby forming oxide traps at or near the upper surface of the BOX layer 314. Exemplary ions for implantation include indium (In) for an N-channel device; arsenic (As) or antimony (Sb) for a P-channel device; and germanium (Ge) or xenon (Xe) for either an N-channel or P-channel device.

The energy level and doping concentration for heavy ion implantation is sufficient to create the above-described oxide trap region 315 at or near the surface of the BOX layer 314. Suitable ranges of energy levels and doping concentrations for the heavy ions may be determined empirically and will depend upon factors such as the type of heavy ion, the thickness of the active region 318 and the like. For the ion species indium, arsenic, antimony, germanium and xenon, and for a typical active region 318 having a thickness of about 500 Å to about 2000 Å, an exemplary energy range for the heavy ion implantation is about 100 keV to about 300 keV, and an exemplary dosage range is between about $1 \times 10^{14}$ to about $1 \times 10^{16}$ atoms/cm$^2$. It will be appreciated that during ion implantation, incidental damage to the active region 318 may occur. This incidental damage is not necessarily a concern, but can be minimized by optimizing the implantation energy and dose of the heavy ions.

After the heavy ion implantation, an oxide material, for example silicon dioxide (SiO$_2$), is then deposited on the exposed upper surface 338 of the SOI structure 340 (not shown). The deposition produces an oxide layer upon the surface 338 of the SOI structure 340. The oxide deposition may be performed, for example, by plasma enhanced chemical vapor deposition (PECVD).

Next, a polysilicon gate electrode is formed in the opening defined by the spacers 376 wherein the nitride layer 335 has been removed. The polysilicon gate electrode may be pre-doped with N+ or P+ dopants. After the polysilicon deposition, a mask may be used to protect the exposed surface of the gate electrode.

Then, the TEOS layer and the mask on the exposed surface of the gate electrode are polished back to the upper surface 338 of the silicon layer 313 over the deep source and drain 324, 326. This completes the formation of the STI regions 316 as well as the device 310. Other isolation techniques that are known in the art may be used to isolate the MOSFET device 310. The polishing is done using conventional techniques, which are well-known in the art. It will be appreciated that the insulator-filled isolation trenches 316 may be formed in an earlier step in the method, rather than being formed as part of the intermediate device shown in FIG. 3C.

In an alternative embodiment of the invention (not shown), an abrupt region may be formed in the channel 20 near the interface of the BOX layer 14. The higher doping concentration of the abrupt region creates a "built-in" electric field within the channel 20, which tends to draw excess carriers toward the BOX layer 14. In an exemplary N-channel SOI device, the carriers are holes. In a P-channel SOI device 10, the carriers are electrons.

Ions are implanted to form the abrupt region in a manner similar as that described above. For an N-channel device, exemplary ions to form a P+ abrupt region include indium. For a P-channel device, exemplary ions for a N+ abrupt region include arsenic and antimony. The energy and dosage of the implantation depends on the type of ion being implanted, the thickness of the active region 18 and so forth. As an example, for implantation of indium into a active region 18 having a thickness of about 500 Å to about 2,000 Å, an exemplary energy range is about 80 keV to about 150 keV and an exemplary dosage range is about $1 \times 10^{14}$ atoms/cm$^2$ to about $1 \times 10^{16}$ atoms/cm$^2$.

In an example embodiment of an N-channel device having a P+ abrupt region, the dopant concentration within the P+ abrupt region, is about $1\times10^{19}$ atoms/cm$^3$ to about $1\times10^{20}$ atoms/cm$^3$ where the remainder of the channel 20 has a concentration of about $1\times10^{17}$ atoms/cm$^3$ to about $5\times10^{18}$ atoms/cm$^3$.

The abrupt region has a thickness which generally depends on the thickness of the active region 18. However, the thickness of the abrupt region is generally less than one-third (⅓) the thickness of the active region 18.

The self-aligned leakage enhance region 15 or oxide trap region contains oxide traps which promote carrier recombination, thereby removing a charge from the channel 20. Thus, the floating body effect is reduced.

The carriers are drawn to the oxide trap region by a bias potential (e.g., having an absolute valve of about 2 V to about 10 V) applied to the SOI structure 40. For an N-channel device, the bias potential is negative and for a P-channel device, the bias potential is positive. Carriers will also be drawn to the oxide trap region by the presence of the abrupt region, as described in more detail above. Thus, the floating body effect may be further reduced.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) device formed on an SOI substrate with a buried oxide (BOX) layer disposed thereon and an active layer disposed on the BOX layer, the SOI device comprising:

a gate defining a channel interposed between a source and a drain formed on the active layer of the SOI substrate; and a leakage enhanced region disposed within the BOX layer and under the gate and wherein the leakage enhanced region has lateral ends that are less than the length of the SOI substrate.

2. The SOI device according to claim 1, wherein a disposable gate is formed before the leakage enhanced region.

3. The SOI device according to claim 1, wherein the leakage enhanced region is formed by heavy ion implantation of at least one element selected from indium (In), arsenic (As), antimony (Sb), argon (Ar), germanium (Ge), neon (Ne), silicon (Si), or xenon (Xe).

4. The SOI device according to claim 1, wherein the concentration of the at least one element in the BOX layer is about $1\times10^{13}$ atoms/cm$^3$ to about $1\times10^{16}$ atoms/cm$^3$.

5. The SOI device according to claim 1, wherein the source and the drain are identically doped.

6. The SOI device according to claim 1, wherein the source and the drain are N+ doped.

7. The SOI device according to claim 1, wherein the gate includes a gate electrode and gate dielectric.

8. The SOI device according to claim 1, wherein a disposable gate is formed before the source and the drain.

9. The SOI device according to claim 1, wherein the source and the drain are formed before the disposable gate.

10. The SOI device according to claim 1, wherein the leakage enhanced region has lateral ends that are less than the length of spacers disposed on sidewalls of the gate.

11. The SOI device according to claim 1, wherein the leakage enhanced region has lateral ends that are about a length of the gate.

12. The SOI device according to claim 1, wherein the leakage enhanced region is formed by self-aligned ion implantation.

13. The SOI device according to claim 1, further including:

an abrupt region within the active region adjacent the interface of the BOX layer.

14. The SOI device according to claim 13, wherein the abrupt region has lateral ends aligned with the gate and the leakage enhanced region.

15. The SOI device according to claim 14, wherein the abrupt region is formed by heavy ion implantation of at least one element selected from indium (In), arsenic (As), or antimony (Sb).

* * * * *